United States Patent
Wuister et al.

(10) Patent No.: US 9,261,784 B2
(45) Date of Patent: Feb. 16, 2016

(54) LITHOGRAPHIC PATTERNING PROCESS AND RESISTS TO USE THEREIN

(75) Inventors: Sander Frederik Wuister, Eindhoven (NL); Vladimir Mihailovitch Krivtsun, Troitsk (RU); Andrei Mikhailovich Yakunin, Mierlo (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/131,141

(22) PCT Filed: May 30, 2012

(86) PCT No.: PCT/EP2012/060133
§ 371 (c)(1),
(2), (4) Date: Jan. 6, 2014

(87) PCT Pub. No.: WO2013/007442
PCT Pub. Date: Jan. 17, 2013

(65) Prior Publication Data
US 2014/0212819 A1 Jul. 31, 2014

Related U.S. Application Data

(60) Provisional application No. 61/505,768, filed on Jul. 8, 2011.

(51) Int. Cl.
*G03F 7/20* (2006.01)
*G03F 7/038* (2006.01)
(Continued)

(52) U.S. Cl.
CPC ............. *G03F 7/0388* (2013.01); *C08F 30/08* (2013.01); *G03F 7/0043* (2013.01); *G03F 7/0758* (2013.01); *G03F 7/2002* (2013.01)

(58) Field of Classification Search
CPC ........... G03F 7/20; G03F 7/30; G03F 7/0758; G03F 7/2039; G03F 7/0388; G03F 7/0043; C08F 30/08
USPC .......................................... 430/322, 325, 967
See application file for complete search history.

(56) References Cited

U.S. PATENT DOCUMENTS 5,061,599 A * 10/1991 Kudo et al. ................. 430/270.1
5,352,564 A * 10/1994 Takeda et al. .............. 430/270.1
(Continued)

FOREIGN PATENT DOCUMENTS

EP  0 440 374    8/1991
EP  1 477 847   11/2004
(Continued)

OTHER PUBLICATIONS

International Search Report mailed Dec. 11, 2012 in corresponding International Patent Application No. PCT/EP2012/060133.
(Continued)

*Primary Examiner* — Brittany Raymond
(74) *Attorney, Agent, or Firm* — Pillsbury Winthrop Shaw Pittman LLP

(57) ABSTRACT

A lithographic process includes the use of a silicon-containing polymer or a compound that includes at least one element selected from the group consisting of: Ta, W, Re, Os, Ir, Ni, Cu or Zn in a resist material for an EUV lithographic process. The wavelength of the EUV light used in the process is less than 11 nm, for example 6.5-6.9 nm. The invention further relates to novel silicon-containing polymers.

31 Claims, 3 Drawing Sheets

(51) Int. Cl.
  *G03F 7/004* (2006.01)
  *C08F 30/08* (2006.01)
  *G03F 7/075* (2006.01)

(56) References Cited

U.S. PATENT DOCUMENTS

| | | | |
|---|---|---|---|
| 6,027,854 | A * | 2/2000 | Nishi et al. ................. 430/270.1 |
| 6,331,378 | B1 | 12/2001 | Endo |
| 6,387,517 | B1 * | 5/2002 | Belleville et al. .............. 428/447 |
| 2002/0182541 | A1 * | 12/2002 | Gonsalves ................. 430/287.1 |
| 2003/0059544 | A1 | 3/2003 | Bravo-Vasquez et al. |
| 2004/0241574 | A1 | 12/2004 | Dai et al. |
| 2004/0241579 | A1 * | 12/2004 | Hamada et al. ............ 430/270.1 |

FOREIGN PATENT DOCUMENTS

| | | |
|---|---|---|
| JP | 52-83062 | 7/1977 |
| JP | 2006-343608 | 12/2006 |
| WO | WO 91/01516 | 2/1991 |
| WO | 02/082184 | 10/2002 |

OTHER PUBLICATIONS

Jason K. Stowers et al. "Directly patterned inorganic hardmask for EUV lithography," Proc. of SPIE, vol. 7969, pp. 796915-1-796915-11 (2011).

Singapore Search Report and Written Opinion dated Feb. 4, 2015 in corresponding Singapore Patent Application No. 2013091921.

* cited by examiner

LITHOGRAPHIC PATTERNING PROCESS AND RESISTS TO USE THEREIN

CROSS-REFERENCE TO RELATED APPLICATIONS

This application is the U.S. national phase entry of International Patent Application No. PCT/EP2012/060133, filed May 30, 2012, which claims the benefit of U.S. provisional application 61/505,768, which was filed on 8 Jul. 2011, both of which are incorporated herein in their entireties by reference.

FIELD

The present invention relates to the use of particular silicon-containing polymers or compounds comprising specific metals for lithographic purposes and to a novel patterning method or process using such polymers or compounds. The invention further relates to silicon-containing polymers per se, and the use of silicon-containing polymers or compounds comprising particular metals as resists in lithographic processes involving Extreme Ultraviolet (EUV) radiations emitting a wavelength of less than 11 nm.

BACKGROUND

In photolithography, a desired pattern is applied onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion on a substrate (e.g. a silicon wafer). Transfer of the pattern is typically via imaging onto a layer of radiation-sensitive material, usually referred to as a resist, which is provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured. A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. Such radiation is sometimes termed soft x-ray radiation. EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. Such a radiation system is typically termed a laser produced plasma (LPP) source. Alternative sources include discharge plasma sources, or sources based on synchrotron radiation provided by an electron storage ring.

In EUV lithography, the choice of wavelengths may be limited by practical considerations involving the availability of suitable radiation sources, optical components and process materials. Current EUV lithography systems all operate using radiation wavelength within the range of 13-14 nm, and many developments remain to be made before EUV lithography is used in volume production. It has further been proposed that EUV radiation with a wavelength of less than 11 nm could be used, for example within the range of 5-10 nm or 5-8 nm, and especially in the so-called '6.x' wavelength region of 6.5-6.9, for example 6.7 or 6.8 nm. The intention is that the shorter wavelength may provide a better resolution (features below the 11 nm node), larger depth of focus (DOF) and higher throughput compared to the 13.5 nm radiation that is currently used. However, the change of wavelength brings a new range of practical considerations and the techniques and materials optimized for 13.5 nm may or may not work at the shorter wavelengths.

A particular challenge for the development of commercial EUV lithography lies in the formulation of radiation-sensitive resist materials that will realize, in etch-resistant material, a high resolution pattern projected by the EUV optical system. Some work has been published concerning the development of resist materials usable at 13.5 nm. The inventors have recognized that quite different solutions may be appropriate for use at shorter wavelengths below 11 nm.

SUMMARY

According to an aspect of the invention, there is provided the use of (i) a silicon-containing polymer or (ii) a compound comprising at least one of the following elements: Ta, W, Re, Os, Ir, Ni, Cu or Zn in a resist material for an EUV lithographic process, wherein the wavelength of the EUV radiation used in the process is less than 11 nm. The wavelength may be in the range 5-8 nm, for example in the range 6.5-6.9 nm, for example around 6.7 or 6.8 nm.

In an embodiment, the resist material is deposited as a film onto a substrate and the film has a thickness ranging from 10 to 100 nm, for example less than 50 nm or even less than 30 nm. In this way, the ratio of resist height to feature width can be maintained less than 3, less than 2.5 or less than 2.

According to an aspect of the invention, there is provided a photolithographic patterning process that includes forming a film of a resist material on a substrate using a material as set forth above, irradiating the resist film with a patterned radiation beam of EUV light of a wavelength of less than 11 nm; and developing the resist film.

According to an aspect of the invention, there is provided a method of manufacturing a device, wherein patterned device features are applied to a substrate by a sequence of lithographic and other processing steps, wherein at least one of the lithographic steps is a photolithographic patterning process that includes use of a material as a resist, according to an aspect of the invention as set forth above.

According to an aspect of the invention, there is provided a method of irradiating a resist film of a resist material with a patterned beam of EUV light having a wavelength of less than 11 nm, the resist material comprising at least one of a silicon-containing polymer and a compound comprising at least one of the following elements: Ta, W, Re, Os, Ir, Ni, Cu or Zn.

According to an aspect of the invention, there is provided a silicon-containing polymer comprising a monomer having the following formula:

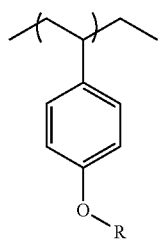

wherein R is a $C_1$ to $C_{20}$ alkylsilyl group or a group having the formula:

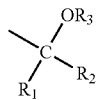

wherein $R_1$, $R_2$ and $R_3$ are each a $C_1$ to $C_{20}$ alkylsilyl group.

The silicon-containing polymer may be used as a resist in a photolithographic process. Specific examples and variations thereof are described further below, to aid understanding the invention.

BRIEF DESCRIPTION OF THE DRAWINGS

Embodiments of the invention will now be described, by way of example only, with reference to the accompanying schematic figures, and in which.

DETAILED DESCRIPTION

Figure 1:
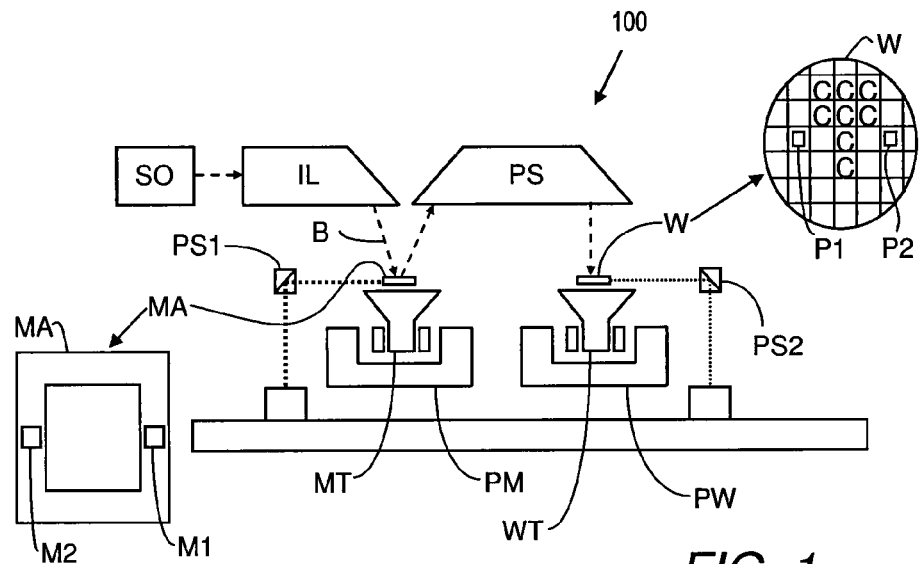
FIG. 1 depicts schematically the functional elements a lithographic apparatus for use in embodiments of the invention.

FIG. 1 schematically depicts a lithographic apparatus 100 for use in embodiments of a device manufacturing process according to one embodiments of the invention. The apparatus comprises: a source collector module SO; an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:
1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.
3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
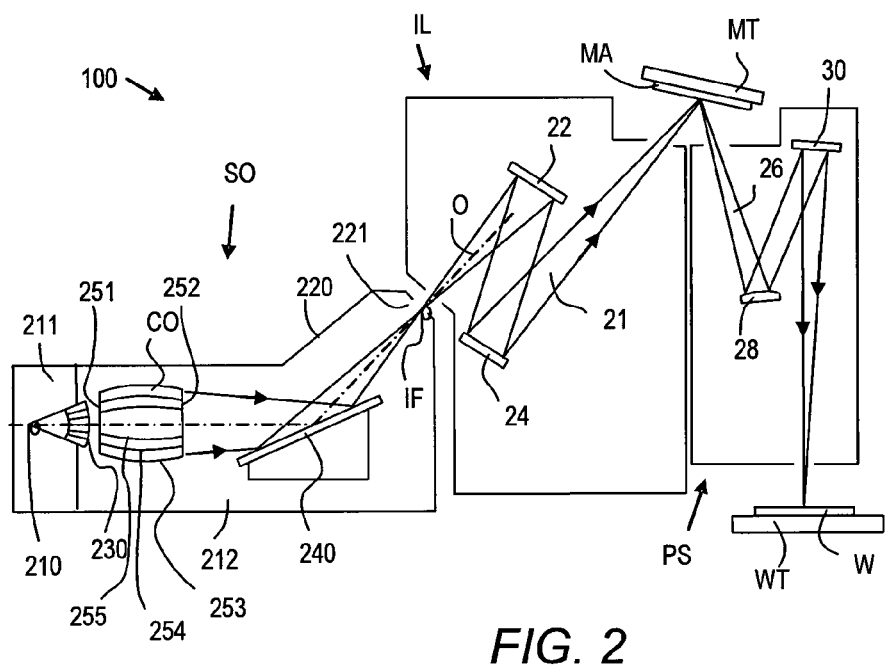
FIG. 2 is a more detailed view of the apparatus of FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is typically used in combination with a discharge produced plasma source, often called a DPP source.

Alternatively, the source collector module SO may be part of an LPP radiation system, using a near-normal incidence collector optic (not shown) In an LPP system, a laser is arranged to deposit laser energy into a fuel material, creating the highly ionized plasma with electron temperatures of several 10's of eV. The energetic radiation generated during de-excitation and recombination of these ions is emitted from the plasma, collected by a near normal incidence collector optic and focused onto the opening 221 in the enclosing structure 220. For 13.5 nm wavelengths, fuels such as xenon (Xe), tin (Sn) or lithium (Li) are used. For 6.x nm radiation, candidates are Gd and Tb as well as their alloys and compounds like $Gd_2O_3$. Energy per photon can be more than 100 eV, for example about 188 eV.

Device Manufacturing Process

A typical patterning process as part of a method for manufacturing a device typically uses the apparatus of FIGS. 1 and 2 to transfer the pattern from patterning device M to a radiation-sensitive resist material ('resist' for short), on substrate W.

Figure 3:
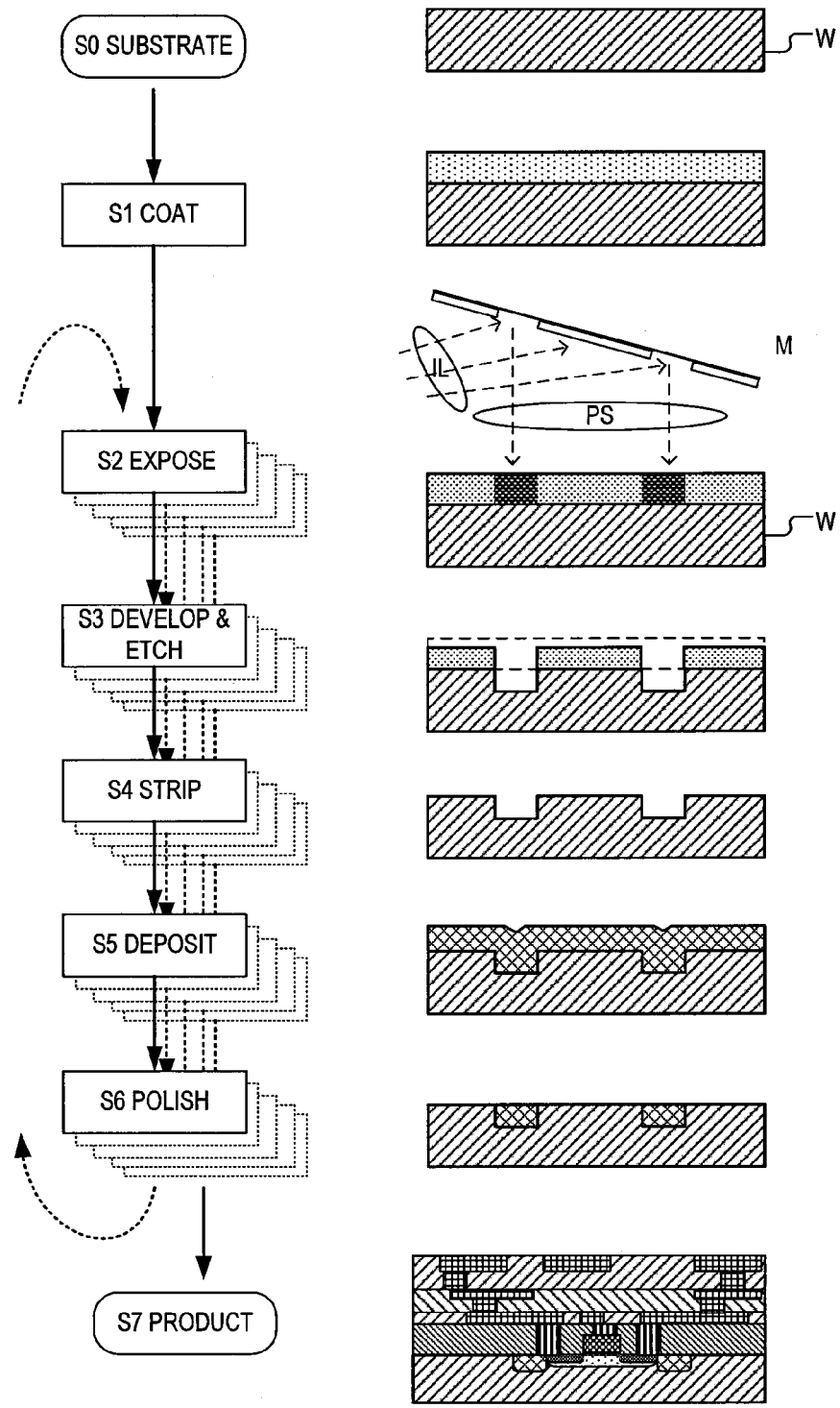
FIG. 3 depicts various steps of a patterning process using a resist according to an embodiment of the invention.

FIG. 3 which depicts seven steps (S0 to S7) involved in patterning processes using resists in order to manufacture items such as ICs. These steps are as follows:

S0: A substrate W is prepared, which may for example be a silicon wafer.

S1 (Coat): The resist solution is spin coated on substrate W to form a very thin, uniform layer. This resist layer can be baked at a low temperature to evaporate residual solvent.

S2 (Expose): A latent image is formed in the resist layer via exposure to EUV using the lithographic apparatus 100 and a suitable patterning device M.

S3 (Develop & Etch): In the case of a 'positive' resist, areas of the resist that have been exposed are removed by rinsing with an appropriate solvent. In the case of a 'negative' resist, areas that have not been exposed are removed. This step is combined with, or followed by, a processing step through the resist pattern to the substrate. The term 'etch' in the drawing is used only as an example. The processing step may include wet or dry etching, lift-off, doping, etc. By whatever process, the applied pattern becomes embodied in the addition, removal or modification of material on the substrate. The illustration shows removal of material, ready for deposition step S5.

S4 (Strip): The remaining resist is removed from the patterned substrate W.

S5 (Deposit): A different substance is deposited to fill the pattern of the substrate W.

S6 (Polish): The excess substance is removed from the wafer W surface by polishing, leaving only the desired pattern within the wafer W.

S1 to S6 steps are repeated with different patterns and different processing steps, to create functional features having the desired patterns in different layers above and below the original surface of the substrate W until the final, multi-layered product is delivered (step S7). The product is typically but not necessarily a semiconductor device such as an integrated circuit.

As discussed, the skilled reader will appreciate that the steps S4 to S6 are merely one example of a process that can be applied in a pattern determined by the exposed resists. Many different types of steps can, and will, be used in the different stages of production. For example, the resist may be used to control a modification of the underlying material, rather than etching it away. Modification may be for example oxidation, doping, for example by diffusion or ion implantation. New material layers may be deposited on top of the substrate. In many processes, the photosensitive resist is merely an intermediate stage in producing a so-called 'hard mask', which reproduces the exposed pattern in a different material. This hard mask is then used to control a process step which etches or modifies underlying material with the desired pattern, but which would not be controlled by the photosensitive resist itself. Thus, depending upon the resulting pattern sought and the sequence of layers and intermediate steps required to build the finished device, the process above mentioned can be varied; some steps being combined and/or removed and some additional steps being added.

When considering resists suitable to be used in an EUV lithography process of below 11 nm, exemplified by the 6.x nm wavelengths, the inventors have identified various challenges to be considered.

When considering 6.x technology in EUV lithography, the aspect ratio (height/width) of the features to be obtained in the resist should be at most 3, desirably 2, and consequently the thickness of the resist film to be considered decreases to a range of about 10 nm to about 100 nm. This is due to a reduction of the depth of focus of the image projected on the resist. Consequently thinner resist films are desired. However, the protective role of the resist, and in particular its resistance to etching, may not be achievable with thinner film due, for example, to thickness variation and micro-channel formation. Thinner films may lead to an increase in thickness variation across the film. This, in turn, may have detrimental effects on subsequent layers of materials provided onto the semiconductor device. Furthermore, the formation of microchannels in thinner films may reach the substrate and expose it to the etching process. This would lead to resists not meeting the minimum performance requirements.

EUV radiations are absorbed by the resist material and produce photoelectrons and secondary electrons. Secondary electrons result in some random exposure which is superimposed to the optical image applied on the resist by the EUV source. This, in turn, leads to loss of resolution, observable line edge roughness and linewidth variation which are referred as a "blurring" phenomenon. This blurring will need to be controlled if a resist is to deliver the high resolution desired in EUV lithography.

Pattern collapse occurs when physical properties of the resist material cannot counteract capillary or repulsion forces exerted on the pattern during the drying of the rinse liquid to a sufficient extent. High rigidity or strength of the resist material is therefore desirable, as well as reduced aspect ratio of the features of the pattern.

Other process parameters which lead to variance in the resolution capability of the resists are, for example, etch resistance and selectivity, quantum yield, baking time and temperature, exposure time and source output, aerial image focus, and develop time and temperature. The capacity of particular resists to allow for some degree of variance in these particular parameters is of course highly desirable to be able to work within specified tolerances.

EUV Resists—Background
Organo-Resists

Traditional organo-resists are polyhydrostyrene-based such as PBS, poly(butene-1-sulphone), and ZEP, poly(methyl a-chloroacrylate-co-a-methylstyrene). These polyhydrostyrene based resins are adapted to patterns greater than 180 nm. Chemically Amplified Resist (CAR) resins were developed as part of the historic change from 365 nm (i-line) to 248 nm (KrF). These resins are also used in combination with 193 nm (ArF) dry and immersion lithography. Although not designed for EUV, their good performance has led to their being used in 13-14 nm technology because of their high sensitivity and contrast, high resolution, dry etch resistance, aqueous development, and process latitude.

In this process, chemical moieties present on the resins release acid groups upon radiation exposure. These acid groups diffuse during a post-exposure bake step and render surrounding polymer soluble in a developer. Acid diffusion helps to increase the resists' sensitivity and throughput, and also to limit line edge roughness due to shot noise statistics. However, the acid diffusion length is itself a potential limiting factor. In addition, too much diffusion may reduce chemical contrast, which may lead again to more roughness. KRS-XE is a CAR developed by IBM and has a high contrast and is based on the use of acetal protecting groups that eliminate the need for post-exposure bake.

United States Patent Application Publication No. 2004/0241574 describes CARs which contain silicon or boron. These CARs are described as being very suitable resists due to their high transparency compared to purely carbon based polymers, at the EUV wavelength of choice, which is disclosed as being above 12.5 nm in United States Patent Application Publication No. 2004/0241574. The present inventors have recognized that a high transparency characteristic, which indicates a lack of interaction between the material and the radiation, is undesirable for lithographic processes using EUV of less than 11 nm, and it is desirable to use the much thinner resist film with low blurring, as discussed above.

Inorganic Resists

Resists can also be made of inorganic material, such as various metal oxides. Inorganic resists can present increased resistance to blurring as well as resistance to pattern collapse due to their strength. Stowers et al., "Directly patterned inorganic hardmask for EUV lithography", proceedings of the SPIE, Volume 7969, pp 796915-796915-11 (2011) describe the use of a hafnium oxide sulfate combined to a peroxo complexing agent to form a negative resist. Exposure to EUV leads to the production of secondary electrons which break the bond of the peroxide groups. Active metal sites are thus produced which react creating cross linked and condensed areas. The unexposed region is removed using a solvent such as TMAH (tetramethylammonium hydroxide).

Selection of Resists for Sub-11 nm EUV Lithography

It is therefore highly desirable to provide a resist material that can meet the demands of EUV photolithography using wavelengths of less than 11 nm, and particularly of 6.x nm. It has now been found that (i) silicon-containing organic polymers as well as (ii) compounds containing Ta, W, Re, Os, Ir, Ni, Cu or Zn, or a mixture thereof, can be particularly advantageous and provide thin resist films of high absorption and lower blur due to a reduced mean free path of photo-generated electrons. Hence, the mean free path of the resist material according to the invention is about 2 nm, while the mean free path of resist materials currently used is about 7 nm.

Example 1

Silicon-Containing Polymers

According to an embodiment of the invention, suitable silicon-containing polymers may comprise from about 0.1 wt % to about 50 wt % silicon. For example, such polymers can be obtained by replacing some alkyl groups of known CARs by silyl groups. Suitable known CARs may include any known polymer resist material used with EUV lithography processes, such as KRS or polyhydroxystyrene resists.

Suitable silyl groups comprise alkylsilyl monomers such as trimethylsilyl $(CH_3)_3Si$—, but may also comprise silicon dimers or polymers such as pentadimethyldisilyl $(CH_3)_3Si$—$(CH_3)_2Si$—. Preferably the alkylsilyl groups comprise 1 to 20 carbon atoms, preferably 1 to 10. It may also be advantageous that the silyl group comprises more than 1 silicon atom, preferably more than 2 and advantageously 4.

A particularly desired silicon-containing polymer according to the invention contains the following structure:

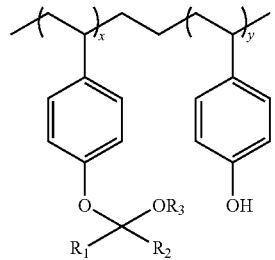

wherein x is an integer ranging from 1 to 400, for example from 20 to 200, y is an integer ranging from 0 to 400, for example from 0 or 20 to 200, and $R_1$, $R_2$ and $R_3$ are each a $C_1$ to $C_{20}$ alkylsilyl group. In an embodiment, only one of $R_1$, $R_2$ and $R_3$ is an alkylsilyl group as defined above and the remaining groups are H, or a carbon based moiety such as $C_1$ to $C_{20}$ alkyl, aryl or alcoxy group.

The silicon containing polymers of embodiments of the invention can be made by any known techniques. For example they can be made by copolymerization of silicon-containing monomers with themselves or other monomers or polymers. Such reactions can be initiated by free radicals created by UV or gamma radiations on specific initiators such as benzoyl peroxide, ammonium persulphate or azobisisobutyronitrile or by the use of reactive ions derived from example from $BF_3$ or $TiCl_4$. Alternatively silicon groups can be introduced by hydrosilylation of a resist polymer through hydrosilylation reaction using silanes such as trimethylsilane, dimethylphenylsilane and dimethylethylsilane.

The resist material is coated onto the desired substrate using well known technologies such as spin coating. The thickness of the deposited layer is advantageously ranging from 10 to 100 nm, and may be less than 50 nm or even less than 30 nm.

Figure 4:
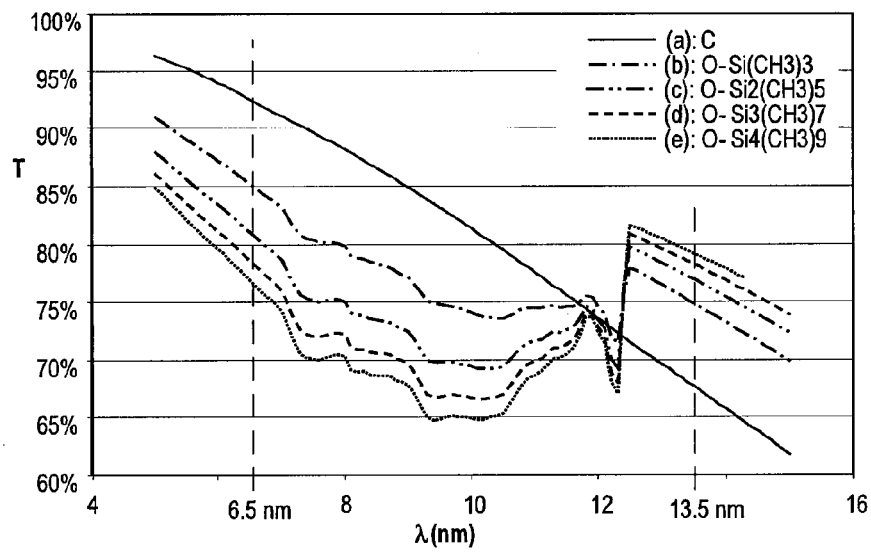
FIG. 4 shows the EUV transmission curves of various silicon-containing polymers of embodiments of the invention compared to a known resist.

FIG. 4 shows, in traces (a) to (e), transmission characteristics for various candidate materials across a range of EUV wavelengths from 4 to 16 nm. Trace (a) corresponds to poly (hydroxystyrene), or PHS, an organic material typically used in many resist materials. Transmission characteristics for proposed new compounds wherein the hydroxyl moiety of the hydroxystyrene has been silylated with various moieties are also shown in traces (b) to (e). These characteristics have been calculated using the Center for X-Ray Optics 'filter transmission' tool which is publicly accessible at http://henke.lbl.gov/optical_constants/filter2.html, and which in turn is based on published material available through libraries and handbooks based on a layer thickness of 100 nm. For thinner layers, transmission T would increase towards 100%, meaning that absorption decreases, for thinner layers.

As absorption of the EUV radiation is a condition for the radiation sensitivity of the resist, absorption is a good indicator of sensitivity of a potential resist at a given wavelength. FIG. 4 clearly shows that for EUV above 12 nm, the silicon-containing materials show high transparency (i.e. transmission of about 70% for PHS vs. 77% for —$Si(CH_3)_3$, 79% for $Si_2(CH_3)_5$, 80% for $Si_3(CH_3)_7$, 81% for $Si_4(CH_3)_9$). However, for EUV having a wavelength of less than 11 nm, the absorption of silicon-containing materials dramatically increases, while the absorption of the PHS material continues to decrease steadily.

Although the absorption of the silicon materials eventually decreases again at EUV wavelengths below about 10.5 nm to 9.5 nm (depending upon the silicon-containing material), their absorption remains substantially higher than that of the silicon-free PHS. These silicon-containing materials are therefore much more suitable to be used as resists for EUV of less 11 nm. At 6.9 nm, the transmission characteristics are 84% for —$Si(CH_3)_3$, 79% for $Si_2(CH_3)_5$, 77% for $Si_3(CH_3)_7$, 75% for $Si_4(CH_3)_9$ while the transmission characteristic of PHS is above 90%. Again, such characteristics evidence the suitability of these silicon-containing polymer for the 6.x EUV lithography technology.

Figure 5:
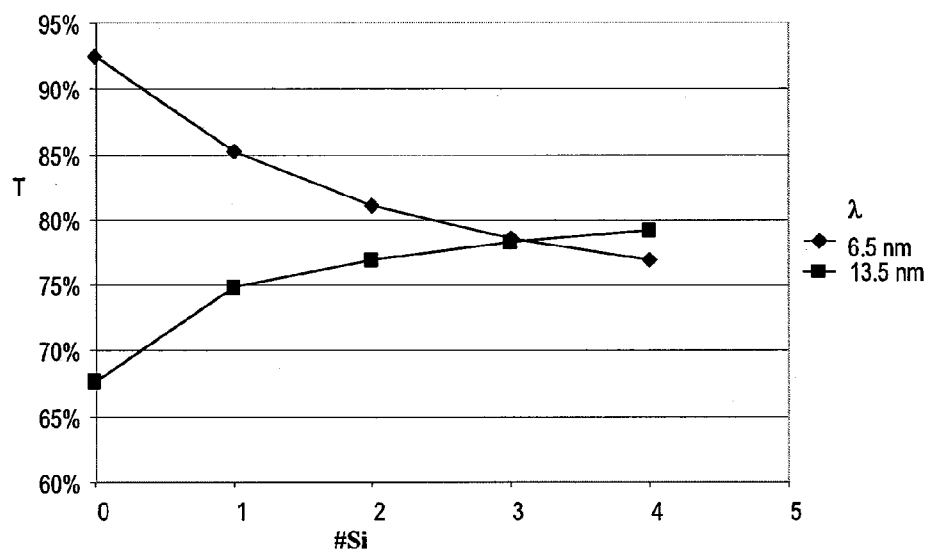
FIG. 5 shows transmission curves at 6.5 nm and 13.5 nm of monomer units of a polymer of an embodiment of the invention, depending upon the number of silicon atoms (if any) they contain.

The number of silicon atoms per monomer also appears from traces (b) to (e) to be correlated with the absorption characteristics of the polymer containing them. FIG. 5 illustrates such a dependency more explicitly. Although for EUV of 13.5 nm the higher the number of silicon atoms, the lower the absorption, this is not the case for EUV of 6.5 nm. In the latter case, the absorption unexpectedly increases with the number of silicon atoms present in the monomer. It is therefore desirable to have the silicon-containing monomer comprising a number of silicon atoms of at least two, desirably higher than 2, and more desirably of 4.

Example 2

Ta, W, Re, Os, Ir, Ni, Cu and Zn-Containing Material as EUV Resist for EUV of Less than 11 nm Compounds containing the above elements, and particularly suitable oxides, are suitable to use in the manufacture of resists. This is demonstrated by percentages of transmission of 6.5 nm radiation for the above elements, for films made of the pure element and which are shown in Table I below.

TABLE I

Percentage Transmission v Film Thickness

| Element | T %@30 nm | T %@5 nm |
|---|---|---|
| Ta | 35.26 | 84.05 |
| W | 32.58 | 82.95 |
| Re* | 32.93 | 83.90* |
| Os | 32.22 | 82.80 |
| Ir | 35.89 | 84.30 |
| Ni | 36.66 | 84.60 |
| Cu | 34.14 | 83.60 |
| Zn | 38.25 | 85.20 |

Transmission values in Table I come from the CXRO database accessible at http://henke.lbl.gov/optical_constants/filter2.html and based on reviewed articles and handbooks. For comparison, Hf which is studied in the Stowers paper, noted above, has lower absorption at 6.5 nm than any of the elements listed above, indicated by transmission figures of 41.89% and 86.5% at 30 nm and 5 nm film thickness, respectively.

These high values of absorption will be exhibited by resist material which incorporates the elements in question. Also, use of such an inorganic material will minimize blurring and reduce pattern collapse due to the increased strength of the material. The compound will advantageously be an oxide of one of these elements, such as tantalum penta ethoxide. The compound can also be a mixture of various oxides. Suitable oxides can also comprise more than one element (i.e. mixed metal oxides). The material can be provided as a sol gel coating and spin coated or vacuum deposited onto the substrate. Ta, W and Zn are particularly suitable for sol gel coating. The metal oxide can be dissolved in simple anhydrous alcohols like ethanol, propanol, butanol or mixture thereof. The concentration may advantageously range from 0.1% to 5% wt. Chelating agents that prevent early hydrolysis may be added. Such chelating agent may be for example organic molecules with a keton or diketon group (e.g. benzoylacetone), typically in equimolar concentrations. After 6.x nm EUV exposure, the resist is developed by dissolving the unexposed material in an anhydrous alcohol.

According to a particular embodiment of the invention a tantalum sol-gel can be obtained using tantalum penta ethoxide $\{Ta(OC_2H_5)_5\}$. Solutions can be made in simple, anhydrous alcohols like ethanol, propanol, butanol or mixtures thereof. Concentration range is between 0.1 and 5% wt. The chelating agent benzoylacetone may be added in equimolar concentration to prevent early hydrolysis. The resulting mixture is spin coated at speeds ranging from 1000 to 5000 RPM. After 6.x nm exposure the sol-gel is developed by dissolving the unexposed resist material in an anhydrous alcohol.

Different resists may be used in different process steps, just as different EUV wavelengths and even non-EUV wavelengths may be used for less critical patterning steps in the overall device manufacturing process. The different resist types introduced above may be used in the different process steps at sub-11 nm EUV wavelengths, to optimize performance for the individual process and pattern being made.

The use of the described resists in EUV lithographic processes can be for the manufacture of integrated circuits, and for other applications, such as in the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. For example, the resist material of the invention can be used in a patterning process which comprises resists comprising multiple layers, in order to protect and/or enhance the invention. The descriptions above are intended to be illustrative, not limiting. Thus it will be apparent to one skilled in the art that modifications may be made to the invention as described without departing from the scope of the claims set out below.

What is claimed is:

1. A method of irradiating a resist film of a resist material with a patterned beam of EUV light having a wavelength of less than 11 nm, the resist material comprising a silicon-containing polymer and/or a compound comprising at least one element selected from the group consisting of: Ta, W, Re, Os, Ir, Ni, Cu and Zn, wherein said silicon-containing polymer comprises a monomer having the following formula:

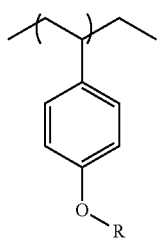

wherein R is a $C_1$ to $C_{20}$ alkylsilyl group or a group having the formula:

wherein $R_1$, $R_2$ and $R_3$ group are each a $C_1$ to $C_{20}$ alkylsilyl group.

2. The method of claim 1, wherein the wavelength is in the range of 5-8 nm.

3. The method of claim 1, wherein the resist material is deposited as a film onto a substrate, and wherein said film has a thickness ranging from 10 nm to 100 nm.

4. The method of claim 1, wherein said alkylsilyl group is selected from the group consisting of: trimethylsilyl, pentamethyldisilyl, heptamethyltrisilyl and nonamethyltetrasilyl.

5. The method of claim 1, wherein said compound is an oxide.

6. The method of claim 1, wherein said element is tantalum.

7. A photolithographic patterning process, comprising:
forming a film of a resist material on a substrate;
irradiating the resist film with a patterned radiation beam of EUV light of a wavelength of less than 11 nm; and
developing said resist film;
wherein said resist material comprises a silicon-containing polymer and/or a compound comprising at least one element selected from the group consisting of: Ta, W, Re, Os, Ir, Ni, Cu and Zn, and
wherein said silicon-containing polymer comprises a monomer having the following formula:

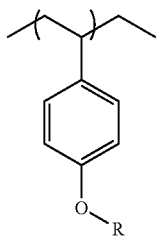

wherein R is a $C_1$ to $C_{20}$ alkylsilyl group or a group having the formula:

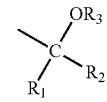

wherein $R_1$, $R_2$ and $R_3$ are each a $C_1$ to $C_{20}$ alkylsilyl group.

8. The process of claim 7, wherein said wavelength is the range of 5-8 nm.

9. The process of claim 7, wherein said film has a thickness ranging from 10 nm to 100 nm.

10. The process of claim 7, wherein said alkylsilyl group is selected from the group consisting of: trimethylsilyl, pentamethyldisilyl, heptamethyltrisilyl and nonamethyltetrasilyl.

11. The process of claim 7, wherein said compound is an oxide.

12. The process of claim 7, wherein said element is tantalum.

13. A resist material comprising a silicon-containing polymer comprising a monomer having the following formula:

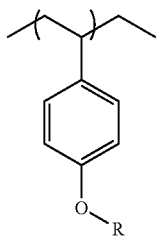

wherein R is a group having the formula:

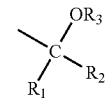

wherein $R_1$, $R_2$ and $R_3$ are each a $C_1$ to $C_{20}$ alkylsilyl group.

14. The resist material according to claim 13, wherein the resist material has a sensitivity for EUV light having a wavelength of less than 11 nm.

15. The resist material according to claim 13, wherein the resist material has a sensitivity for EUV light having a wavelength in the range of 5-8 nm.

16. A method of manufacturing a device, wherein patterned device features are applied to a substrate by a sequence of lithographic and other processing steps, and wherein at least one of said lithographic steps is a photolithographic patterning process, comprising:

forming a film of a resist material on a substrate;
irradiating the resist film with a patterned radiation beam of EUV light of a wavelength of less than 11 nm; and
developing said resist film;
wherein said resist material comprises a silicon-containing polymer and/or a compound comprising at least one element selected from the group consisting of: Ta, W, Re, Os, Ir, Ni, Cu and Zn, and
wherein said silicon-containing polymer comprises a monomer having the following formula:

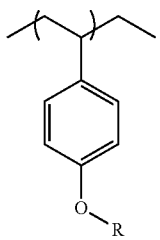

wherein R is a $C_1$ to $C_{20}$ alkylsilyl group or a group having the formula:

wherein $R_1$, $R_2$ and $R_3$ are each a $C_1$ to $C_{20}$ alkylsilyl group.

17. A method of using a silicon-containing polymer or a compound comprising at least one element selected from the group consisting of: Ta, W, Re, Os, Ir, Ni, Cu and Zn in a resist material for an EUV lithographic process, wherein the wavelength of the EUV radiation used in said process is less than 11 nm, wherein said silicon-containing polymer comprises a monomer having the following formula:

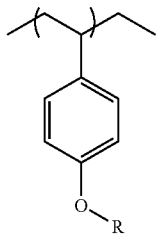

wherein R is a $C_1$ to $C_{20}$ alkylsilyl group or a group having the formula:

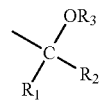

wherein $R_1$, $R_2$ and $R_3$ group are each a $C_1$ to $C_{20}$ alkylsilyl group.

18. The method of claim 17, wherein said wavelength is in the range of 5-8 nm.

19. The method of claim 18, wherein the resist material is deposited as a film onto a substrate and wherein said film has a thickness ranging from 10 to 100 nm.

20. The method of claim 17, wherein said alkylsilyl group is chosen in the group comprising trimethylsilyl, pentamethyldisilyl, heptamethyltrisilyl and nonamethyltetrasilyl.

21. The method of claim 17, wherein said compound is an oxide.

22. The method of claim 17, wherein said element is tantalum.

23. A resist material comprising a compound comprising at least one element selected from the group consisting of: Ta, W, Re, Os, Ir, Ni, Cu and Zn, wherein the resist material has a sensitivity for EUV light having a wavelength of less than 11 nm.

24. The resist material according to claim 23, wherein said compound is an oxide.

25. The resist material according to claim 24, wherein said oxide is dissolved in an anhydrous alcohol.

26. The resist material according to claim 23, wherein said element is tantalum.

27. The resist material according to claim 26, wherein said compound is a tantalum penta ethoxide.

28. The resist material according to claim 23, wherein said compound has a reduced mean free path of photogenerated electrons.

29. The resist material according to claim 28, wherein said mean free path is about 2 nm.

30. The resist material according to claim 23, wherein said material is provided as a sol gel.

31. The resist material according to claim 23, wherein the resist material has a sensitivity for EUV light having a wavelength in the range of 5-8 nm.

* * * * *